US009671920B2

(12) United States Patent
Portmann et al.

(10) Patent No.: US 9,671,920 B2
(45) Date of Patent: Jun. 6, 2017

(54) COMPENSATION OF A TARGET OBJECT COUPLING TO FEEDING LINES IN CAPACITIVE SENSING SYSTEM

(71) Applicant: Microchip Technology Incorporated, Chandler, AZ (US)

(72) Inventors: Lionel Portmann, Lausanne (CH); Axel Heim, Munich (DE); Andreas Dorfner, Munich (DE); Claus Kaltner, Bergkirchen (DE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 1 day.

(21) Appl. No.: 14/750,181

(22) Filed: Jun. 25, 2015

(65) Prior Publication Data

US 2015/0378482 A1    Dec. 31, 2015

Related U.S. Application Data

(60) Provisional application No. 62/017,671, filed on Jun. 26, 2014.

(51) Int. Cl.
| | | |
|---|---|---|
| G06F 3/045 | (2006.01) | |
| G06F 3/047 | (2006.01) | |
| G06F 3/044 | (2006.01) | |
| H03K 17/96 | (2006.01) | |

(52) U.S. Cl.
CPC .............. *G06F 3/047* (2013.01); *G06F 3/044* (2013.01); *H03K 17/962* (2013.01); *G06F 2203/04103* (2013.01); *H03K 2217/94094* (2013.01); *H03K 2217/96023* (2013.01); *H03K 2217/960765* (2013.01)

(58) Field of Classification Search
CPC ........... G06F 2203/04103; G06F 3/044; G06F 3/047; H03K 17/962; H03K 2217/94094; H03K 2217/96023; H03K 2217/960765
See application file for complete search history.

(56) References Cited

U.S. PATENT DOCUMENTS

| | | | |
|---|---|---|---|
| 2008/0036751 A1* | 2/2008 | Yamazaki | G06F 3/0412 345/205 |
| 2014/0036166 A1* | 2/2014 | Kurasawa | G02F 1/13338 349/12 |
| 2014/0132335 A1 | 5/2014 | Rauhala et al. | 327/517 |

FOREIGN PATENT DOCUMENTS

| | | | | |
|---|---|---|---|---|
| EP | 2405328 A2 | 1/2012 | ............. | G06F 3/044 |
| EP | 2597553 A1 | 5/2013 | ............. | G06F 3/041 |
| WO | 2013/172820 A1 | 11/2013 | ........... | H03K 17/975 |

OTHER PUBLICATIONS

International Search Report and Written Opinion, Application No. PCT/US2015/037752, 9 pages, Sep. 10, 2015.
"MGC3130—Sabrewing Single-Zone Evaluation Kit User's Guide," Microchip Technology Incorporated, 34 pages, © 2013.

\* cited by examiner

*Primary Examiner* — Kumar Patel
*Assistant Examiner* — Insa Sadio
(74) *Attorney, Agent, or Firm* — Slayden Grubert Beard PLLC (57) ABSTRACT

An input device has one or more electrodes configured for capacitive sensing, an electronic circuit, one or more conductive feed line(s) connecting the one or more electrode(s) with the electronic circuit, wherein the device is configured to increase or decrease a signal received from at least one of the electrodes through an associated feed line in function of at least one other signal from another electrode.

17 Claims, 8 Drawing Sheets

Figure 17

COMPENSATION OF A TARGET OBJECT COUPLING TO FEEDING LINES IN CAPACITIVE SENSING SYSTEM

RELATED PATENT APPLICATION

This application claims priority to commonly owned U.S. Provisional Patent Application No. 62/017,671 filed Jun. 26, 2014; which is hereby incorporated by reference herein for all purposes.

TECHNICAL FIELD

The present disclosure relates to capacitive sensing systems and method of operating such, in particular to the compensation of a target object's capacitive coupling to feeding lines in the capacitive sensing system.

BACKGROUND

The "GestIC®" integrated circuit, also known as MGC3130 manufactured by Applicant, is a highly sensitive capacitive sensing technology, its sensitivity revealing the problem addressed in this disclosure. Various application notes regarding GestIC®—Technology are available for download at Applicant's website, for example, application note "MGC3130—Sabrewing Single-Zone Evaluation Kit User's Guide", published 2013 by Microchip Technology Inc. is hereby incorporated by reference.

Such an integrated circuit is coupled with various electrodes for generating an alternating electric field, for example using a 100 kHz square wave signal fed to a transmission electrode. A plurality of receiving electrodes are used to sense distortions in the generated electric field and process received signals to compute a three-dimensional location of an object, such as a finger or a hand entering the detection field.

The feeding lines between the integrated circuit and the electrodes may cause unwanted additional capacitive coupling in such a system. Other capacitive based sensing systems, such as one-dimensional (e.g. buttons) or two-dimensional (e.g. Touchpads) sensing systems may face similar problems.

SUMMARY

Hence, there is a need for an improved de-coupling or evaluation of sensed signals in capacitive sensor systems.

According to an embodiment, an input device may comprise one or more electrodes configured for capacitive sensing, an electronic circuit, one or more conductive feed line(s) connecting said electrodes with said electronic circuit, wherein the device is configured to increase or decrease a signal received from at least one of the electrodes through an associated feed line in function of at least one other signal from another electrode.

According to a further embodiment, the associated feed line can be routed at least partly in parallel with the another electrode. According to a further embodiment, the associated feed line can be routed in the vicinity of the another electrode. According to a further embodiment, the input device may further comprise one or more additional feed lines connected to the electronic circuit which are not connected with any electrodes, wherein the at least one other signal is generated by the one or more additional feed lines wherein the one or more additional feed lines each operate as an electrode. According to a further embodiment, an additional feed line can be arranged in the vicinity of another feed line. According to a further embodiment, an additional feed line may run at least partly in parallel with the another feed line. According to a further embodiment, an additional feed line can be arranged in the vicinity of another electrode. According to a further embodiment, the input device may comprise analog circuitry to receive, amplify and filter the signal. According to a further embodiment, the input device may comprise digital circuitry to process the received signal. According to a further embodiment, the electronic circuit may comprise a processor configured to compute a position of an object within a three-dimensional detection space or to detect movement patterns or gestures of said object from received sensor signals. According to a further embodiment, an electrode can be split into multiple segments and a feed line is routed between at least two electrode segments, wherein the electrode segments are galvanically connected through a connection line. According to a further embodiment, a signal from an electrode connected with the feed line routed between the at least two electrode segments can be corrected by a signal received from the multiple segment electrode multiplied by a compensation factor.

According to another embodiment, a method for compensating parasitic capacitive coupling effects in a capacitive sensor system comprising one or more electrodes coupled with an electronic circuit through one or more conductive feed lines may comprise the step of increasing or decreasing a signal received from at least one of the electrode through an associated feed line in function of at least one other signal from another electrode.

According to a further embodiment, the method may further comprise routing the associated feed line in parallel with the another electrode. According to a further embodiment, the method may further comprise routing the associated feed line in the vicinity of the another electrode. According to a further embodiment, the method may further comprise arranging one or more additional feed lines connected to the electronic circuit which are not connected with any electrodes, wherein the at least one other signal is generated by the one or more additional feed lines, wherein the one or more additional feed lines each operate as an electrode. According to a further embodiment of the method, an additional feed line can be arranged in the vicinity of another feed line. According to a further embodiment of the method, an additional feed line can be arranged in the vicinity of another electrode. According to a further embodiment of the method, an additional feed line may run at least partly in parallel with the another feed line. According to a further embodiment, the method may further comprise the step of increasing or decreasing the signal by an analog circuitry. According to a further embodiment, the method may further comprise the step of increasing or decreasing the signal by a digital circuitry. According to a further embodiment, the method may further comprise computing a position of an object within a three-dimensional detection space from received sensor signals. According to a further embodiment, the method may further comprise splitting an electrode into multiple segments and routing a feed line between at least two electrode segments, wherein the electrode segments are galvanically connected through a connection line. According to a further embodiment, the method may further comprise correcting a signal from an electrode connected with the feed line and routed between the at least two electrode segments by a signal received from the multiple segment electrode multiplied by a compensation factor.

DETAILED DESCRIPTION

Human interface devices (HID) using capacitive sensing comprise sensor electrodes that are often formed in layers of electrically conductive material, e.g. stripes of copper. These electrodes are electrically connected to a detection unit using so-called feeding lines made of (possibly the same) conductive material. The detection unit's measurement value, among others, depends on the position of a target object (finger/hand) in the sensor electrode's vicinity which influences the capacitive coupling between electrode and target, yielding a target measurement signal. In the following, an exemplary detecting system is based on GestIC®-Technology. However, the various embodiments are not restricted to such a system but may improve performance of other capacitive based detection system.

The problem is that a feeding line is often affected likewise when not effectively shielded from the target objects influence. Shielding is not always practical with constructions having few layers (example: single layer PCB or ITO glass). The target object does then influence a measurement value even when located at positions where it should not do so. The signal processing algorithms evaluating the measurement data typically assume a system model where a sensor's measurement depends on the target's position relative to the sensor electrode—but not on the feeding lines—for the sake of simplicity and hence robustness of the system. Given unshielded feeding lines, these assumptions then may become wrong causing the system's performance to decrease.

Figure 14:
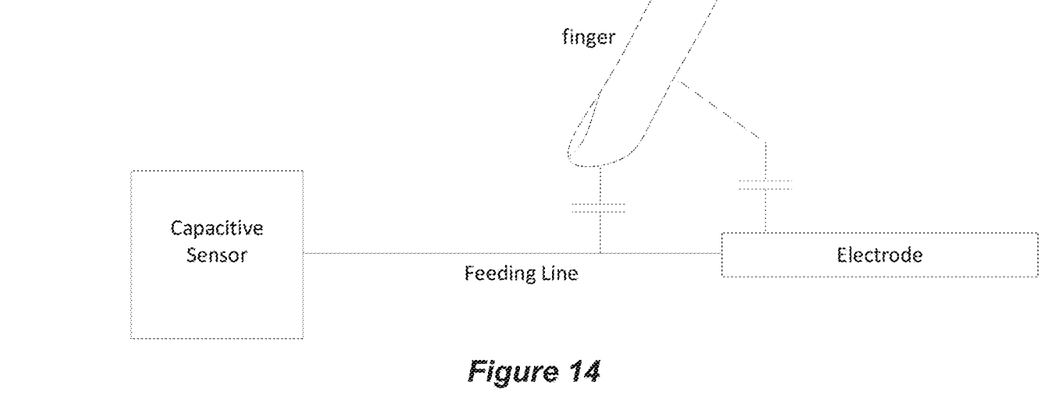
FIG. 14: shows a parasitic capacitive coupling of a feed line connected with a capacitive electrode.

FIG. 14 shows the typical capacitive coupling that is caused by an object, e.g. a finger, between the finger and the electrode as well as the unwanted capacitive coupling between the finger and the feeding line that connects the electrode to an evaluation circuit.

According to various embodiments, the effect of the undesired coupling between target object and feeding line onto the measurement data can be compensated or at least partially compensated by subtracting in software (a fraction of) the measurement value of another electrode which is assumed to be influenced in a similar way as the feeding line by the target. This other electrode can be a pre-existing electrode or a dummy or compensation electrode introduced particularly for the purpose of compensation.

In all figures, reference symbol "B" refers to the board or substrate holding the electrodes. Reference symbol "F" refers to the object to be detected, such as for example, a hand, finger or other. Reference symbols "N, W, S and E" refer to cardinal electrodes with substantial effective surface meant to couple with the object to be detected. Reference symbol "IC" refers to the sensor circuit. Reference symbols "FN, FW, FS and FE" refer to conductive feed lines which electrically link the electrodes to the sensor circuit. Reference symbol "FD" refers to an additional feed line. Reference symbol "FLEX" refers to a flexible PCB bonded with the surface holding the electrodes; wherein the bonding is done with bond pads labeled "BP."

Figure 1:
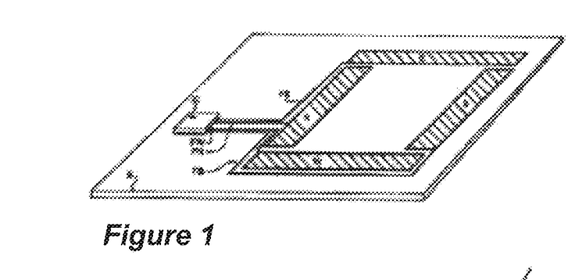
FIG. 1: The electrode S is connected with feed line FS routed outward of electrode W.

FIG. 1 shows a typical input device arrangement using an alternating electric near-field detection method having a transmission electrode and a plurality of detection electrodes, for example, arranged on a printed circuit board B. However, other substrates may apply. The top copper plane is patterned to create the actual reception electrodes N, W, S, and E. Furthermore, feeding lines FN, FW, FS, and FE are patterned to connect the reception electrodes with an evaluation circuit, such as a GestIC MGC3130 integrated circuit. The transmission electrode is not shown in FIG. 1 and is usually arranged on the bottom side or within an intermediate layer of the printed circuit board. It generally covers the entire area of the reception electrodes N, W, S, and E. Alternatively, the TX electrode can also be in the center of the top layer. The TX electrode may cover the entire area defined by the reception electrodes or be even larger. According to other embodiments, the TX electrode does not need to cover the complete area. A TX electrode which only covers the center area or a part of the center area will also be operational.

Figure 2:
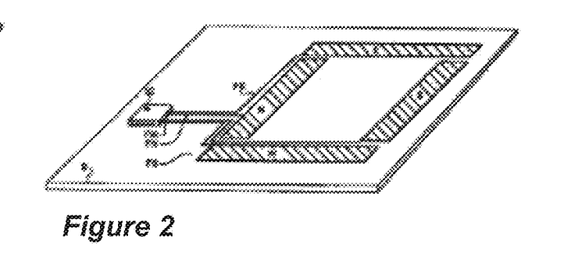
FIG. 2: Electrode S is connected with feed line FS routed inward of electrode W.

As shown in FIGS. 1 and 2, the feeding lines FN, FW, FS, and FE can be arranged in different ways depending on respective routing. For example, FIG. 1 shows that the feeding line FS of for the reception electrode S goes around the outside of reception electrode W whereas in FIG. 2 the path is chosen to be along the inside of reception electrode W.

Figures 3, 5:
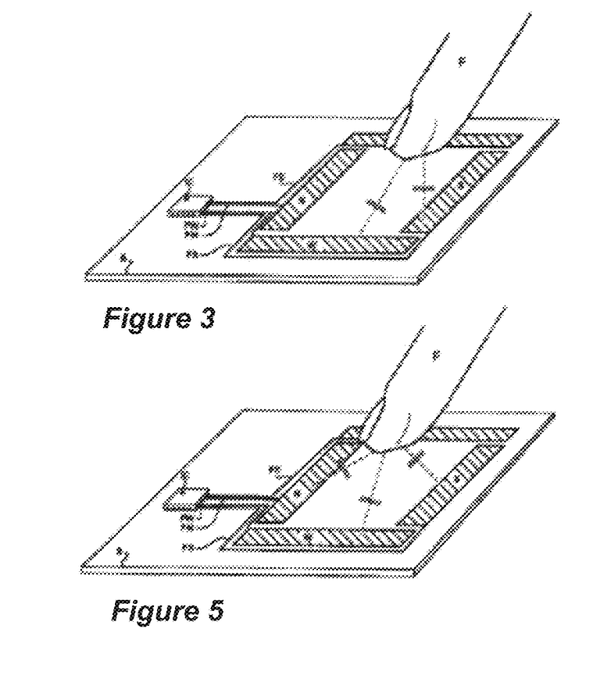
FIG. 3: An object F located near electrodes S and W, with respective couplings $C_{FS}$ and $C_{FW}$.
FIG. 5: An object F located in the middle of the system, interacting with the electrodes N, S and W with respective couplings $C_{FN}$, $C_{FS}$ and $C_{FW}$.

FIG. 3 shows the effect of an approaching finger F of a user and its associated capacitive coupling with respect to reception electrodes W and S. Such a coupling creates different attenuation of the alternating electric field and the evaluation circuit within the integrated circuit IC is able to calculate a position of the finger from the received data.

Figures 4, 6:
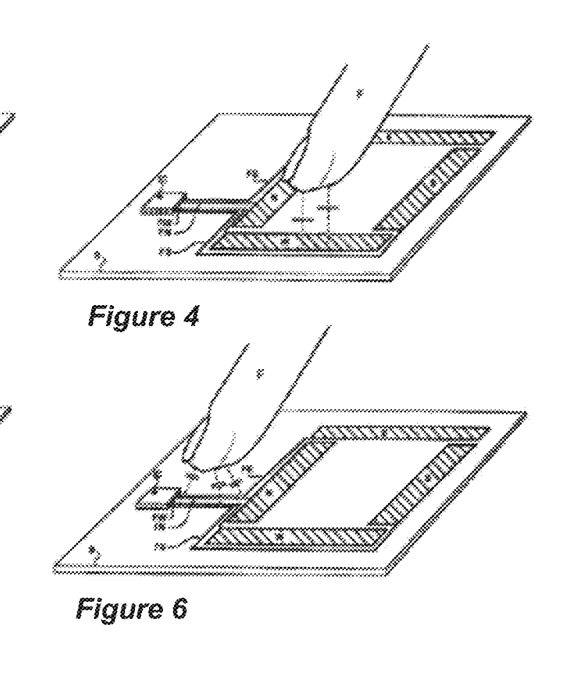
FIG. 4: An object F located above electrode W and above feed line FS, with a coupling $C_{FW}$ and a parasitic coupling $C_{FFS}$.
FIG. 6: An object F located above the feed lines FN, FS and FW, with respective parasitic couplings $C_{FFN}$, $C_{FFS}$ and $C_{FFW}$.

A problematic situation may be created as shown in FIG. 4. Here, the finger F is located above reception electrode W. It can be noticed that a parasitic coupling $C_{FFS}$ appears between the finger F and the south feed line FS. Such a parasitic coupling can lead to a false interpretation of the signals similar to the situation of the FIG. 3, where the finger legitimately couples with both electrodes S and W.

Figure 16:
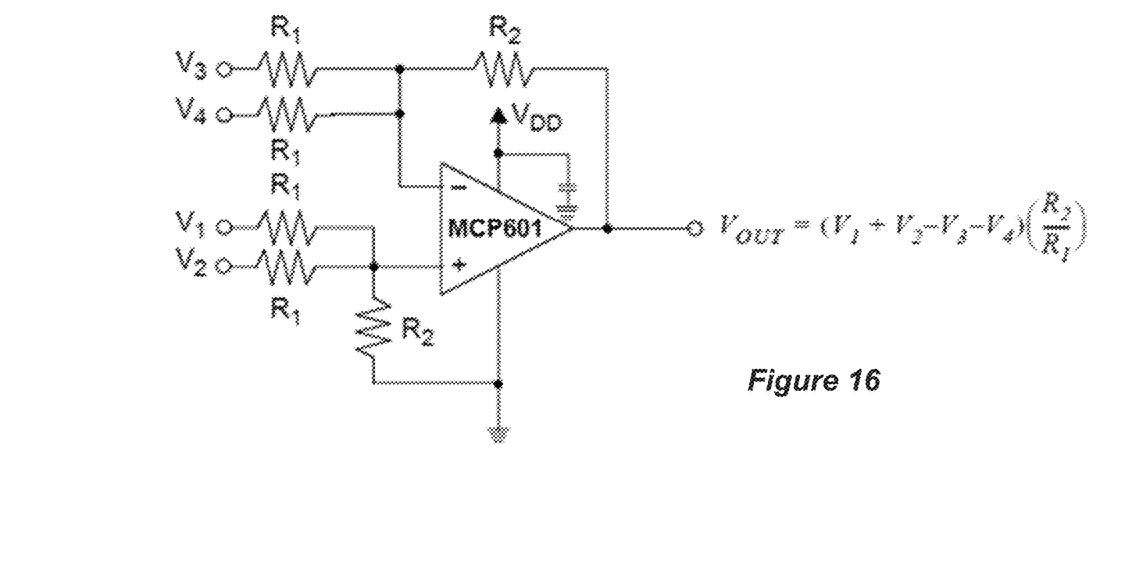
FIG. 16: shows an example for a circuit for adding or subtracting signals

According to various embodiments, the following solution can be provided: The south electrode S has a long feed line FS running along electrode W, so it becomes possible to correct the electrode S signal, for example by equation (1).

$$Scorr = S - ksw*W \qquad (1)$$

where Scorr is the corrected S signal and ksw is a correction factor for the influence of W on S, or for the similitude of coupling between finger and W or finger and FS. Scorr can also be computed with a more complex correction function involving for example a polynomial expression with more than a single factor k or any other linear or non-linear function and involving the signal of more than just W electrode. This is generally known in mathematics as space mapping techniques. Analog circuitry may be incorporated within the integrated circuit IC to perform the compensation. FIG. 16 shows an example of such a circuit. It is commonly known as a summing amplifier, with different weights and signs applied to the different input signals $V_1$, $V_2$, $V_3$, $V_4$ (corresponding to signals from electrodes S, W, E or N) and where the corrected output Scorr (based on or equal to $V_{out}$) is the result of a weighted sum. A detailed description can be found in Microchips Application note 682, FIG. 7 and equation 5 which is hereby incorporated by reference in its entirety. The capacitor connected to the supply voltage is optional. Alternatively according to other embodiments, digital circuitry may be used, in particular firmware may perform the respective compensation.

Here the word "signal" can apply to different situations. The term "signal" can mean the alternating current (AC) variation of the electrical potential carried by one feed line; and the "signal" could be inverted and scaled with a differential amplifier or an inverting amplifier. "Signal" can also mean the average AC amplitude of one feed line observed over a longer period. Here this average can be performed with analog integrator circuits. "Signal" can refer to the output of an analog to digital converter circuit. Signal can refer to the result of a mathematical computation from a set of ADC values, like digital demodulation or the output of the Cascaded Integrator Comb (CIC) filter implemented in the integrated circuit manufactured by Applicant and available under the name "MGC3130.".

Figure 15:
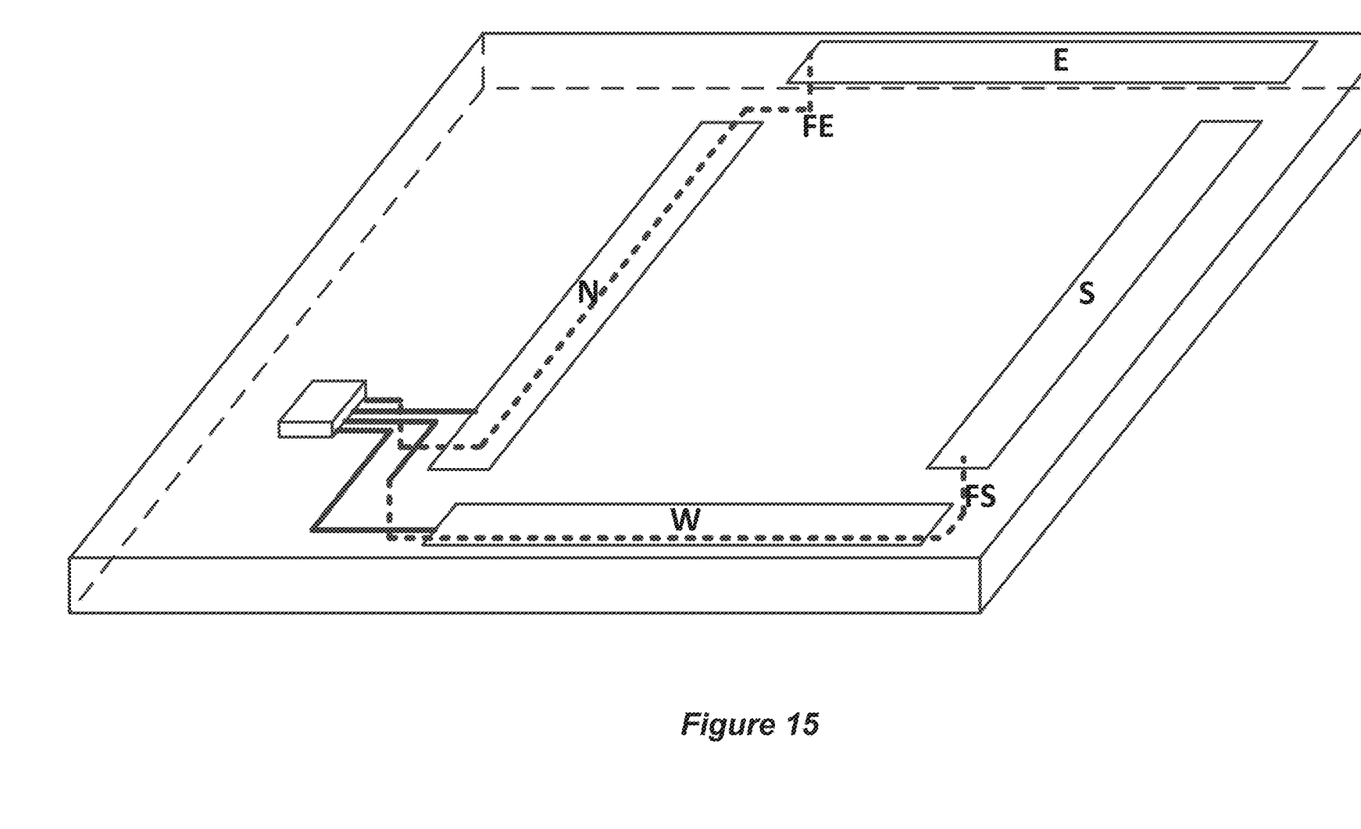
FIG. 15: shows an example with feeding lines routed below receiving electrodes

If the feed line is routed on the same layer as the electrode, the effect of the finger on the feed line may include some error, because there is only one finger position for perfect compensation. If the finger is closer to the feed line or closer to the electrode, a compensation error may occur. This error can be kept low, if the electrode shields the feed line which is associated to the correction. Both electrode and feed line will then be effected in the same way. FIG. 15 shows an arrangement in which the receiving electrodes are arranged on the top layer. Alternatively, they could also be arranged within an intermediate layer. In this embodiment as shown in FIG. 15, the feed line (FE) to the East electrode (E) is routed below the North electrode (N) to keep this compensation error small. For example, the feed lines FE and FS could be routed on a bottom layer or an intermediate layer that is below the electrode layer as shown in FIG. 15. Vias may be used to switch routing to another layer as known in printed circuit manufacturing technology.

Figure 7:
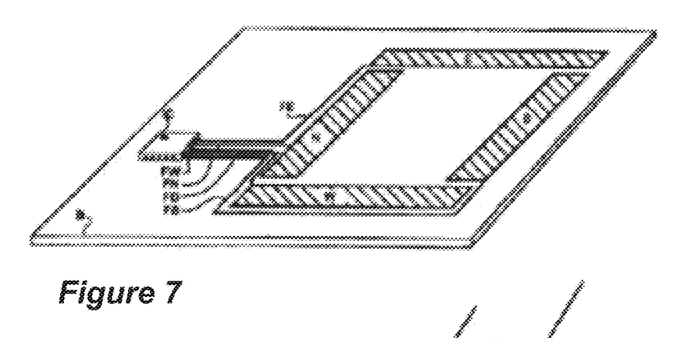
FIG. 7: An additional feed line FD, not connecting to an electrode parallel to the other feed lines FN, FS, FW and FE.
Figure 10:
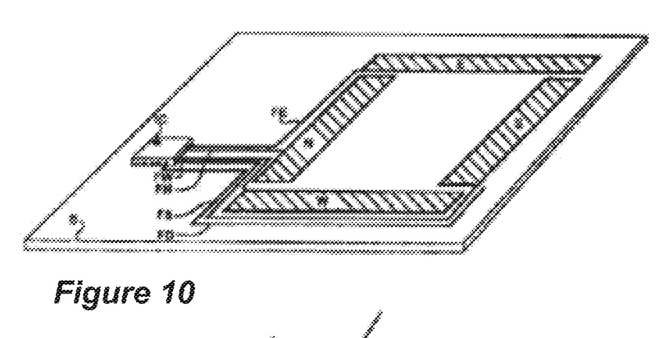
FIG. 10: Dummy feeding line running along with south feed line.
Figure 13:
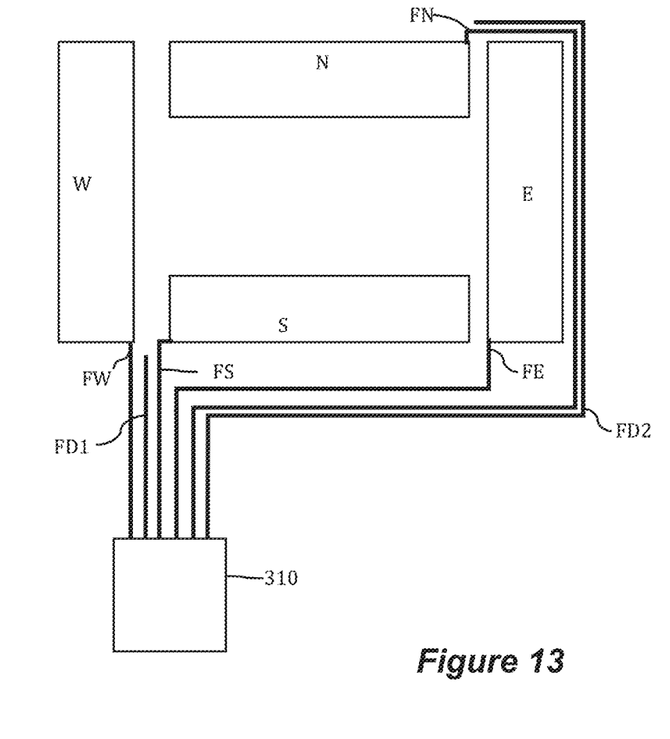
FIG. 13: a top view of a PCB with two dummy lines.
Figure 17:
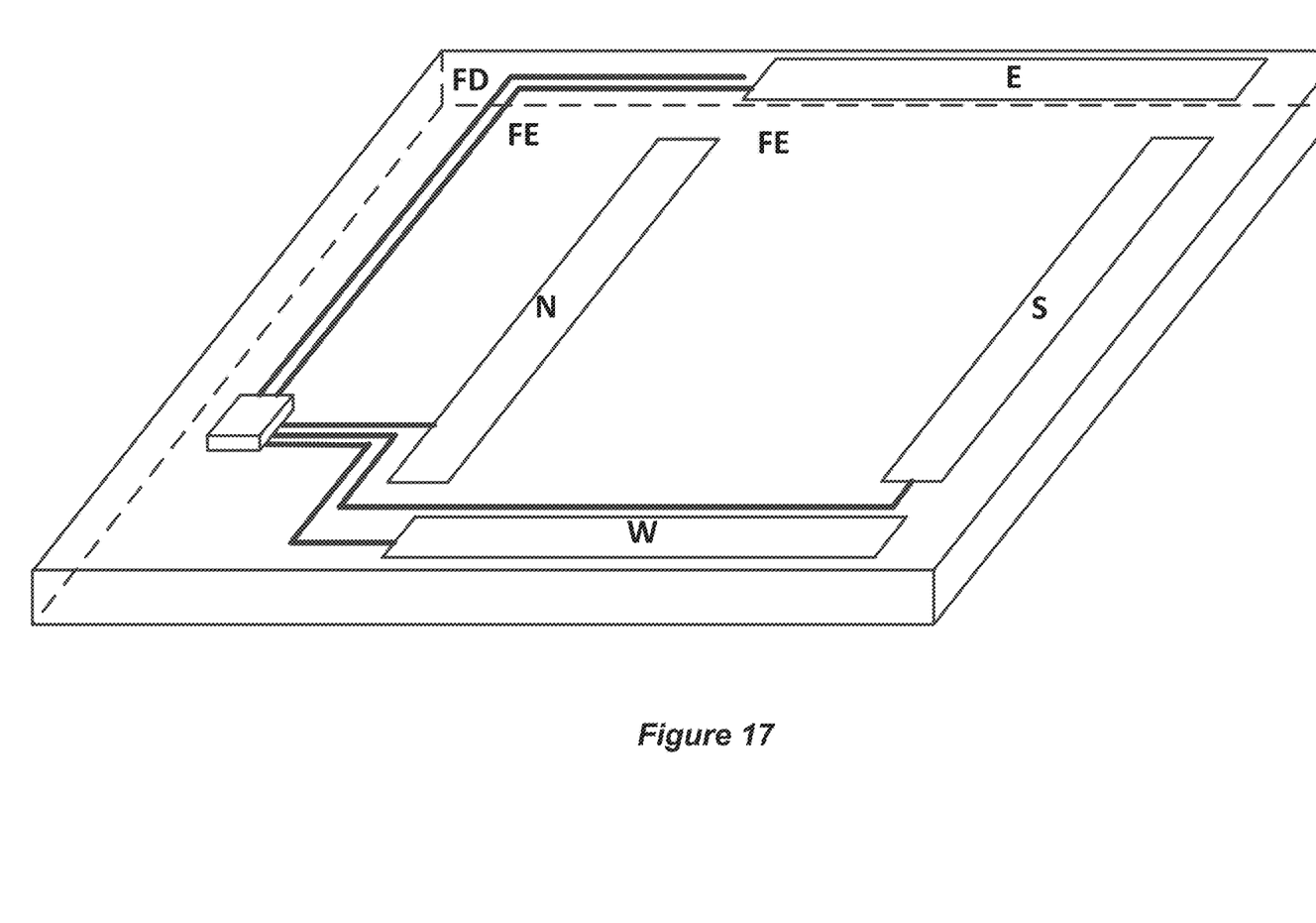
FIG. 17: shows an example for an electrode setup with a dummy line

A further improvement of the compensation accuracy can be obtained with additional feed line (FD), laid out in a manner to reproduce the coupling of a feed line with the object; it is not mandatory that it is coplanar with other feed lines. The additional feed line can also be restricted to appear only for selected sections of the feed lines, for example where other shielding was not practical or the subtraction with other signals does not give the best compensation because the feed is on a different location as shown in FIG. 17. The surface of the additional feed line can also be adjusted for the purpose to provide a more precise amount of correction without the need of electronic means. Thus, the additional feed line or feed lines may be wider or narrower in shape. Moreover, laser trimming could be used to adjust the capacitance of a respective compensation feed line according to some embodiments. According to other embodiments, any adjustment could also be made in software. FIGS. 7, 10 and 17 show a perspective view according to various examples of such an arrangement. A top view that combines the compensation feed lines of FIGS. 7 and 10 is shown in FIG. 13 wherein the compensation feed lines are marked with reference symbols FD1 and FD2, respectively. The compensation feed line FD in FIG. 10 runs in parallel with feed line FS. The evaluation circuit is shown with reference symbol 310 in FIG. 13. According to some embodiments, a compensation feed line can be provided for each feed line. However, as shown in FIG. 13, a first compensation feed line FD1 may be used for compensation of the section in which all feed lines run in parallel and only a second compensation feed line FD2 is used for the long feed line FN in the embodiment of FIG. 13. If the feed line for some circumstances has to be routed separated from other electrodes and thus receive a different signal, an additional dummy line (FD) can be used. FIG. 17 shows the compensation of such a setup using a dummy feeding line (FD) for compensation of the feed to the east electrode (FE).

Figure 8:
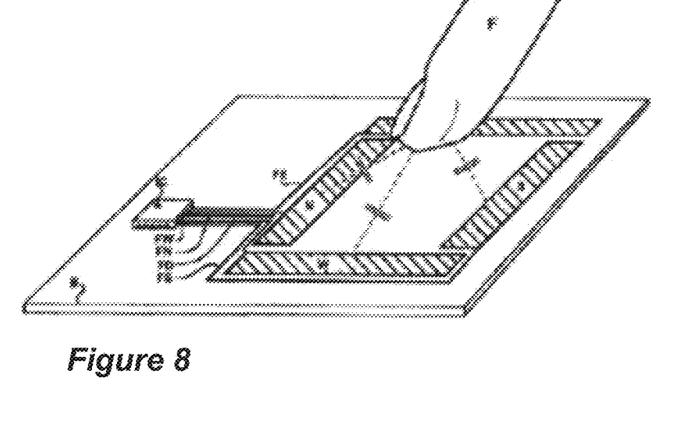
FIG. 8: An object F located in the middle of the system, interacting with the electrodes N, S and W. with respective couplings $C_{FN}$, $C_{FS}$ and $C_{FW}$, but not directly interacting with the feed line FD.
Figure 9:
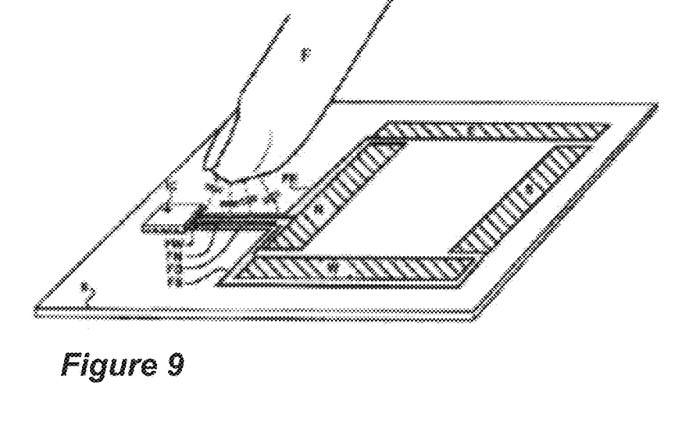
FIG. 9: An object F located above the feed lines FN, FS, FW and FD with respective parasitic couplings $C_{FFN}$, $C_{FFS}$, $C_{FFW}$ and $C_{FFD}$.

FIGS. 8 and 9 show an exemplary capacitive coupling of a finger F when approaching the sensor device. FIG. 8 shows an approach of a finger F within the main detection area of the sensor arrangement and respective capacitive couplings with the main reception electrodes. FIG. 9 shows a position of finger F near the area where all feed lines are connected to the evaluation device IC and its capacitive couplings.

Figure 11:
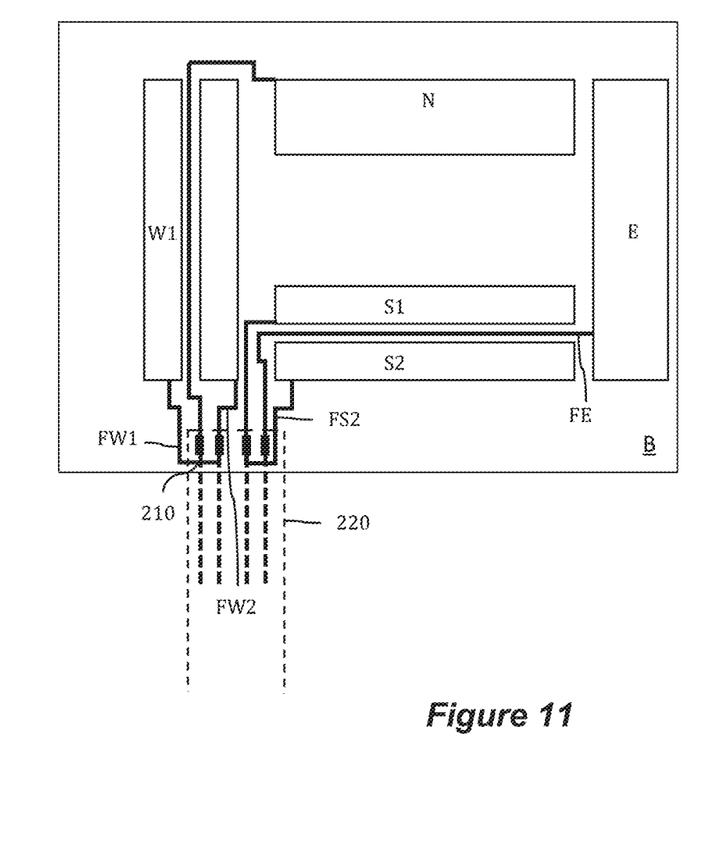
FIG. 11: Electrode W is divided in two, W1 and W2, and feed line FN is routed between W1 and W2. Same for feed line FE passing between electrode S divided into two regions, S1 and S2. Feed lines FS1 and FS2 join at the bond pad BP, same for FW1 and FW2.
Figure 12:
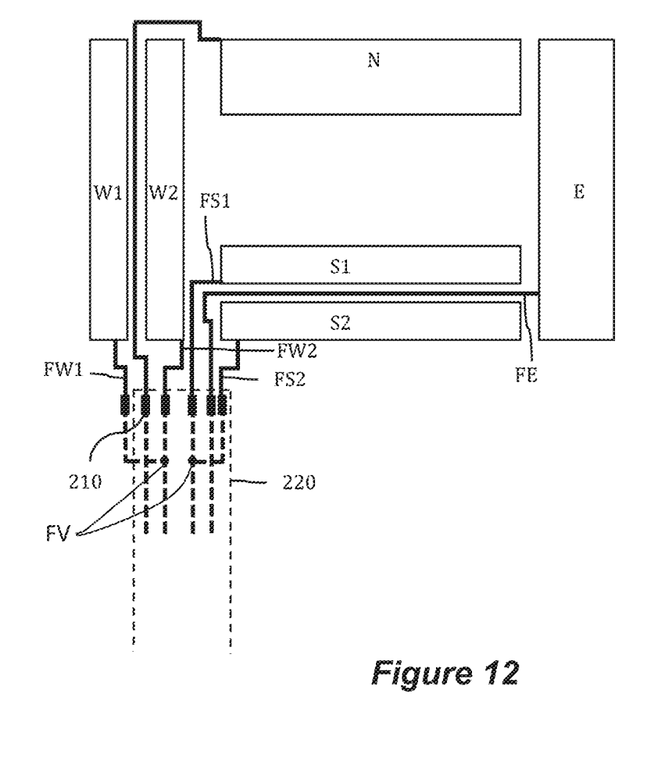
FIG. 12: example where more bond pads are used, and vias FV on the flexible PCB are used to link FW1 and FW2, as well as FS1 and FS2.

A further improvement is disclosed, referring to FIGS. 11 and 12, where the critical feed lines FN and FE are routed inside the electrodes W and S. The sensitivity profile of these feed lines therefore correspond well with the sensitivity of electrodes W and S. As a result, reception electrodes W and S are split into two but are galvanically coupled together by means of the feed lines. The coupling of the split electrodes W1, W2 and S1, S2 can be performed on the top layer in the embodiment of FIG. 11. Alternatively, the coupling can be arranged on the bottom (dotted line traces) or any intermediate layer as shown in FIG. 12.

The embodiment of FIG. 11 shows also bond pads 210 for connecting a cable 220, in particular, a ribbon cable or a flexible flat connection cable in case the evaluation device is not arranged on the printed circuit board B. According to yet another embodiment, in particular when the evaluation device is arranged on the printed circuit board as shown in FIGS. 1-10, 13, 15 and 17, a bottom layer may be used to connect the feed lines with the integrated circuit IC. The dotted connection lines in FIGS. 11 and 12 show such an interconnection.

What is claimed is:

1. An input device comprising one or more electrodes configured for capacitive sensing, an electronic circuit, one or more conductive feed line connecting said electrodes with said electronic circuit, further comprising one or more additional feed lines connected to the electronic circuit which are not connected with any electrodes, wherein at least one other signal is generated by the one or more additional feed lines wherein the one or more additional feed lines each operate as an electrode and wherein the at least one other signal is used to correct a sensor signal;
wherein an electrode is split into multiple segments and a feed line is routed between at least two electrode segments, wherein the electrode segments are galvanically connected through a connection line.

2. The input device according to claim 1, wherein an additional feed line is arranged in the vicinity of another feed line.

3. The input device according to claim 2, wherein an additional feed line runs at least partly in parallel with the another feed line.

4. The input device according to claim 1, wherein an additional feed line is arranged in the vicinity of another electrode.

5. The input device according to claim 1, comprising analog circuitry to increase or decrease the sensor signal.

6. The input device according to claim 1, comprising digital circuitry to increase or decrease the sensor signal.

7. The input device according to claim 1, wherein the electronic circuit comprises a processor configured to compute a position of an object within a three-dimensional detection space or to detect movement patterns or gestures of said object from received sensor signals.

8. The input device according to claim 1, wherein a signal from an electrode connected with the feed line routed between the at least two electrode segments is corrected by a signal received from the multiple segment electrode multiplied by a compensation factor.

9. A method for compensating parasitic capacitive coupling effects in a capacitive sensor system comprising one or more electrodes coupled with an electronic circuit through one or more conductive feed lines, the method comprising arranging one or more additional feed lines connected to the electronic circuit which are not connected with any electrodes, and generating the at least one other signal by the one or more additional feed lines, wherein the one or more additional feed lines each operate as an electrode, and
correcting a sensor signal by the at least one other signal.

10. The method according to claim 9, wherein an additional feed line is arranged in the vicinity of another feed line.

11. The method according to claim 9, wherein an additional feed line is arranged in the vicinity of another electrode.

12. The method according to claim 11, wherein an additional feed line runs at least partly in parallel with the another feed line.

13. The method according to claim 9, comprising the step of increasing or decreasing the signal by an analog circuitry.

14. The method according to claim 9, comprising the step of increasing or decreasing the signal by a digital circuitry.

15. The method according to claim 9, further comprising computing a position of an object within a three-dimensional detection space from received sensor signals.

16. A method for compensating parasitic capacitive coupling effects in a capacitive sensor system comprising one or more electrodes coupled with an electronic circuit through one or more conductive feed lines, the method comprising the steps of:
splitting an electrode into multiple segments and routing a feed line between at least two electrode segments, wherein the electrode segments are galvanically connected through a connection line, and
increasing or decreasing a signal received from at least one of the electrode through an associated feed line by a signal received from said at least two electrode segments.

17. The method according to claim 16, further comprising correcting a signal from an electrode connected with the feed line and routed between the at least two electrode segments by a signal received from the multiple segment electrode multiplied by a compensation factor.

* * * * *